(12) United States Patent
Choi et al.

(10) Patent No.: US 6,211,856 B1
(45) Date of Patent: Apr. 3, 2001

(54) GRAPHICAL USER INTERFACE TOUCH SCREEN WITH AN AUTO ZOOM FEATURE

(76) Inventors: Sung M. Choi, 22420 Creston Dr., Los Altos, CA (US) 94024; Jan Van Ee, 330 Elan Village La. #130, San Jose, CA (US) 95134

( * ) Notice: Subject to any disclaimer, the term of this patent is extended or adjusted under 35 U.S.C. 154(b) by 0 days.

(21) Appl. No.: 09/062,364

(22) Filed: Apr. 17, 1998

(51) Int. Cl.[7] .............................. G09G 5/26; G06F 3/00; G06T 3/40
(52) U.S. Cl. ..................... 345/130; 345/339; 345/439
(58) Field of Search ...................... 345/123, 130, 345/156, 158, 169, 173, 352, 327, 348–351, 339, 179, 168, 439; 348/734

(56) References Cited

U.S. PATENT DOCUMENTS

| | | | |
|---|---|---|---|
| 4,746,981 | * 5/1988 | Nada et al. | 345/127 |
| 4,751,507 | * 6/1988 | Hama et al. | 345/131 |
| 5,001,697 | * 3/1991 | Torres | 364/521 |
| 5,063,535 | * 11/1991 | Jacobs et al. | 395/575 |
| 5,119,079 | * 6/1992 | Hube et al. | 345/146 |
| 5,463,725 | 10/1995 | Henckel et al. | 395/155 |
| 5,491,495 | * 2/1996 | Ward et al. | 345/173 |
| 5,565,888 | * 10/1996 | Selker | 345/127 |
| 5,726,883 | * 3/1998 | Levine et al. | 364/188 |
| 5,739,744 | * 4/1998 | Roca et al. | 340/20 |
| 5,886,697 | * 3/1999 | Naughton et al. | 345/348 |
| 5,956,025 | * 9/1999 | Goulden et al. | 345/327 |
| 5,973,691 | * 10/1999 | Servan-Schreiber | 345/342 |
| 5,986,657 | * 11/1999 | Berteig et al. | 345/357 |

OTHER PUBLICATIONS

IBM, Systems Application Architecture, Jun. 1989.*

* cited by examiner

*Primary Examiner*—Vijay Shankar
*Assistant Examiner*—Manour M. Said
(74) *Attorney, Agent, or Firm*—Edward W. Goodman

(57) ABSTRACT

A graphical user interface "touch screen" having an entire collection of icons displayed at a scale in which the individual function of each icon is recognizable, but too small to easily access features of the function, and wherein upon touching the screen area accommodating an area of the icon, the screen provides a zoomed in version of that area so that the user can select a desired feature.

13 Claims, 3 Drawing Sheets

GRAPHICAL USER INTERFACE TOUCH SCREEN WITH AN AUTO ZOOM FEATURE

BACKGROUND OF THE INVENTION

1. Field of the Invention

The invention relates, in general, to electronic devices having a relatively small display for providing a graphical user interface, and, in particular, to a hand-held electronic device having a graphical user interface ("GUI") and "touch screen" for accessing an entire collection of functions of the electronic device.

2. Description of the Prior Art

Icons are well known in the art of graphical user interfaces (GUI's) for controlling information processing systems. An icon is a small pictorial representation of some larger set of information. An icon provides information, in a condensed format, about the content or status of the underlying system. Icons are designed to trigger, through visual perception, operator concepts that communicate the content or operation of the system in a quick manner. The system then can be easily accessed or used through actuation of the icon.

An example of a controller unit for a home entertainment system is the Stage 3 Controller unit of Kenwood, described in Kenwood's publicly available manual "STAGE 3/ Setting up your KC-Z1 Controller", 1996. The control unit includes a hand-held controller with a touch screen functionality for the GUI. The GUI provides a large number of icons that correspond to a large number of system functionalities. The functionalities are activated through the icons on the touch screen. The GUI is user-programmable to select the icons that should be present in the main menu and those that should not. This is due to the relatively small amount of screen space available to the GUI.

Today's home entertainment systems have a large number of functions available to the user. The Kenwood Controller unit uses a GUI to extend the number of functions that are available. The problem with GUI displays for hand-held devices, such as remote controls for consumer electronic devices, for personal digital assistants (PDAs) and other portable data devices, and even for photocopiers is that they are relatively tiny. Adding the touch screen functionality to these displays means the displayed icons have to be large enough to be accessible by a person's fingers or if the icons are tiny, then they must be large enough so that some type of stylus can be used to "touch" the icon. If larger icons are used the number of functionalities to be displayed diminishes. These drawbacks limit the use of touch screen displays on hand-held devices.

SUMMARY OF THE INVENTION

Accordingly, it is an object of the invention to provide a GUI touch screen display on a hand-held device that provides a maximum number of icons on the display yet the features of the icons are easily accessible by a user.

This object is achieved by providing a zoom feature whereby a relatively small icon is provided on the GUI such that its functions are recognizable but not easily accessable by a user, but upon touch of the icon by a user the icon is made larger or magnified so that its functions can be accurately touched by a user's finger or stylus. Assuming the original icon is a picture of a keyboard, the icon in accordance with the invention is large enough to make the displayed keys "recognizable", but too small to allow individual keys to be conveniently accessed by the user. When the keyboard icon is touched by the user, in one embodiment of the invention, the area of the icon that is touched, e.g., the keys surrounding the "G" key, is magnified or zoomed in, such that this area fills the entire space that was provided for the original keyboard icon. Alternatively in another embodiment, when the keyboard icon is touched by the user, the entire icon becomes larger to basically fill the screen of the GUI or just the area touched becomes large enough to fill the screen of the GUI.

In yet another embodiment of the invention, the user can scroll across the keyboard such that new areas become magnified.

The invention pertains to electronic devices having relatively small displays for providing touch screen GUI's and to hand-held electronic devices, such as remote controls and personal digital assistants, PDA's. The devices include a display for displaying a GUI, and a controller for enabling a user to control the system through a touch screen functionality of the GUI. The GUI provides a lay-out for each of the icons and the controller and GUI in conjunction provide a magnifying functionality that will zoom in on the icon to a magnification convenient for touch screen actuation.

The invention accordingly comprises the several steps and the relation of one or more of such steps with respect to each of the others, and the apparatus embodying features of construction, combinations of elements and arrangement of parts which are adapted to effect such steps, all as exemplified in the following detailed disclosure, and the scope of the invention will be indicated in the claims.

BRIEF DESCRIPTION OF THE DRAWINGS

The invention is explained in further detail by way of example and with reference to the accompanying drawings, wherein.

DETAILED DESCRIPTION OF THE PREFERRED EMBODIMENTS

Graphical user interfaces are well known in the art. U.S. Pat. No. 5,463,725, hereby incorporated by reference, is an example of a GUI with touch screen functionality.

Figure 1C:
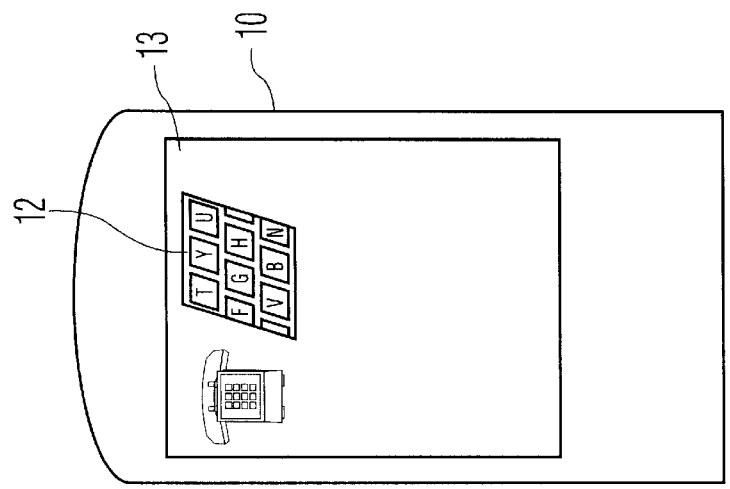
FIG. 1c is a diagram of the PDA of FIG. 1a wherein the zoomed in area of the icon fills the icon area only.
Figure 1B:
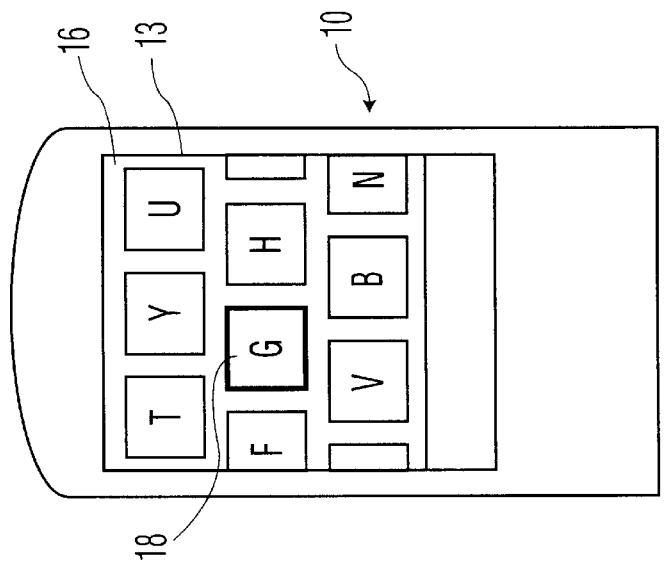
FIG. 1b is a diagram of the PDA of FIG. 1a after the user has touched the keyboard icon at approximately the letter "H" location.
Figure 1A:
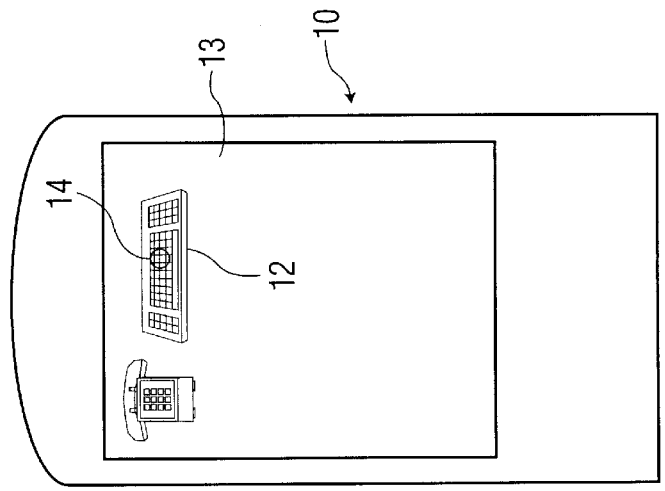
FIG. 1a is a diagram of a PDA GUI touch screen showing a keyboard icon.

FIGS. 1a and 1b show a PDA 10 having a touch-screen GUI 13 in accordance with the invention. The keyboard icon 12 is displayed such that it is large enough to see its functionalities, but too small for convenient touch screen activation of a single key. If a user touches area 14 of the keyboard icon 12 the resulting display 16 is shown in FIG. 1b. As can be seen from this display 16 the individual keys surrounding area 14 are magnified and large enough for easy touch screen activation of a single key by a finger, such as the "G" key 18 or any other nearby key. Upon releasing the "G" key 18 the key is highlighted indicating its activation and the GUI 13 then redisplays the original icon 12. Although FIG. 1b shows the actual size of the icon increasing, this is not a requirement of the invention. Alternatively, the icon can stay the same size but a feature of the icon will be magnified or zoomed in on as shown in FIG. 1c.

In another embodiment of the invention, when the icon 12 is touched at 14 and released and the features of the icon are magnified, the user can make a selection of a key or feature and upon release of the user's finger, after key selection, the icon does not automatically return the display 16 to the initial state 12, but instead the user can make another selection. After a predetermined time period has elapsed without a key selection being made, the icon returns to its original state 12.

In a further embodiment of the invention, the user can move across the entire keyboard by touching a particular edge of the magnified area causing magnification of the next area of the keyboard thus achieving a scrolling effect. In this embodiment of the invention, upon selection of a function or key of the icon, the icon will return to its original size, or again the icon could remain magnified until a predetermined time period elapses without a key being selected.

Figure 2A:
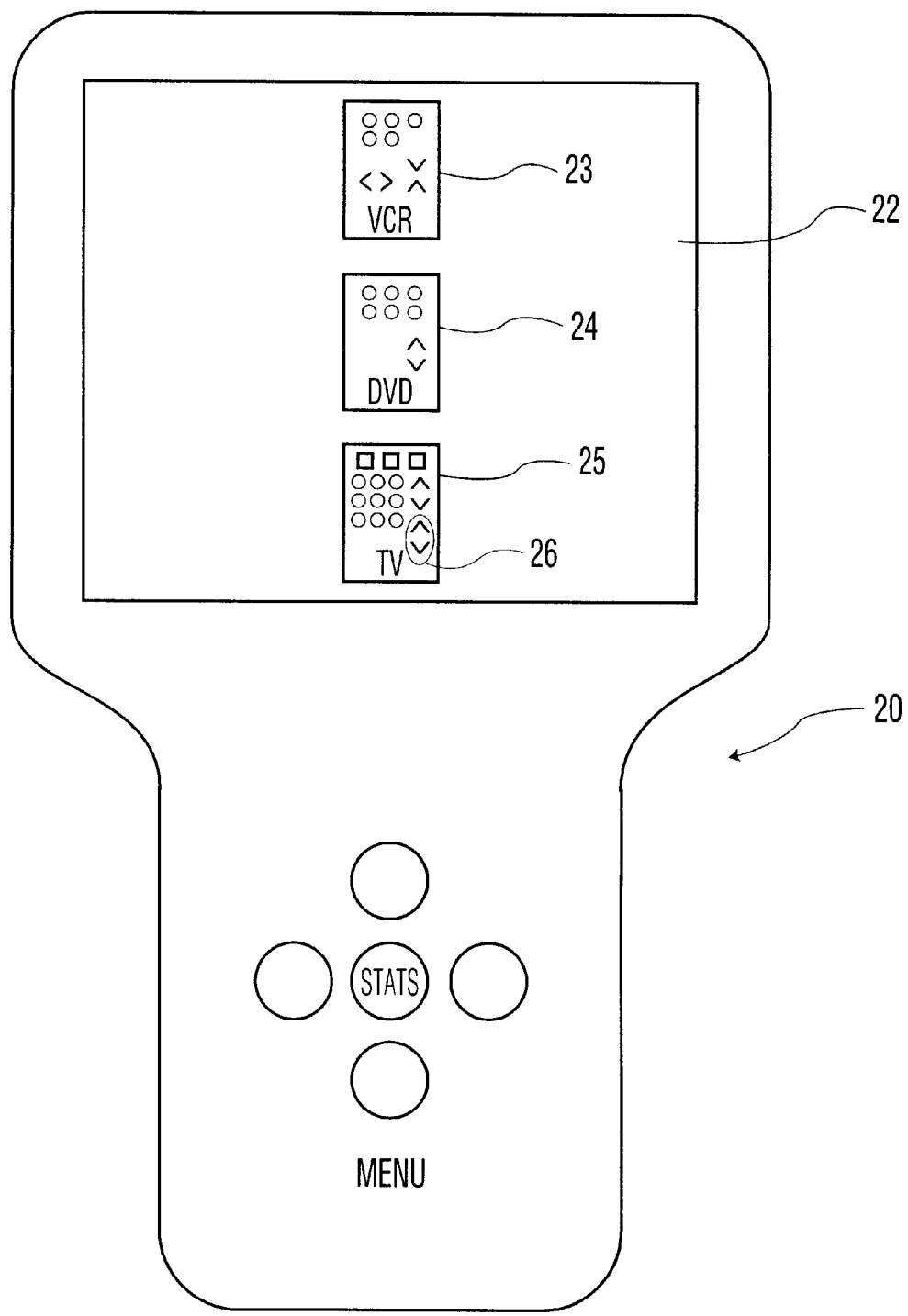
FIG. 2a is a diagram of a remote control device GUI touch screen keypad showing a keyboard icon.
Figure 2B:
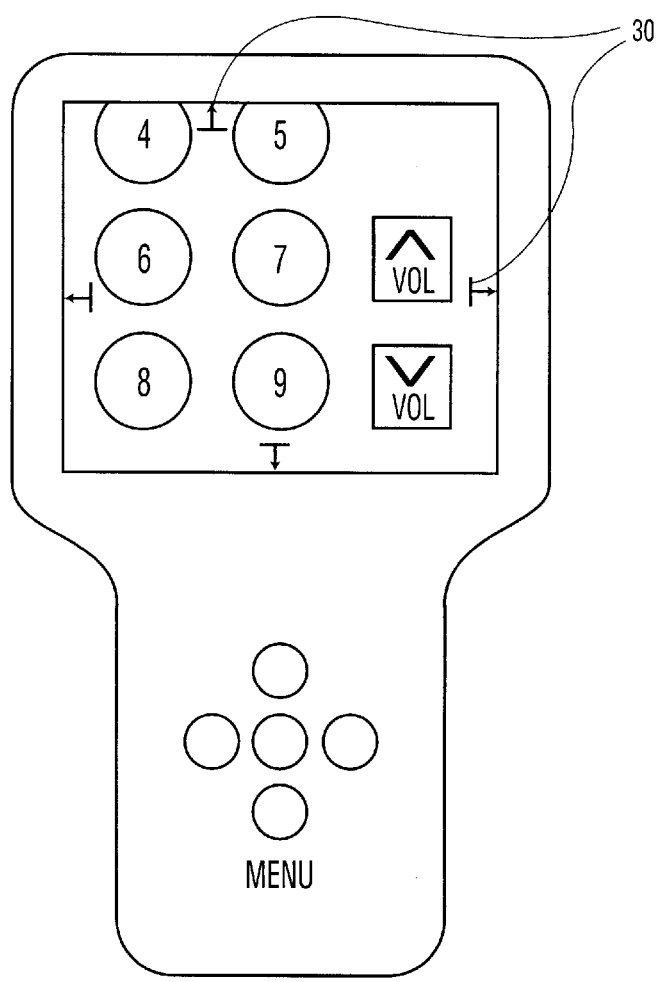
FIG. 2b is a diagram of the remote control device in FIG. 2a when the vol ^ portion of the icon in FIG. 2a is touched.

FIG. 2a shows a remote control for a consumer electronic device 20 having a touch-screen GUI 22. There are three icons displayed: the VCR icon 23, the DVD icon 24 and the TV icon 25. Each icon is too small to easily access the plurality of keys associated with the icon, however, the keys are recognizable. Upon touching one of the icons it will enlarge the area surrounding the point of touch 26 as shown in FIG. 2b or alternatively, if the display is large enough, all of the keys for a particular device may be accessible. The functionalities, such as scrolling 30, explained above with regard to the PDA can also be included in the remote control. In addition the icon itself can remain the same size but a feature of the icon will be zoomed in on.

Figure 3:
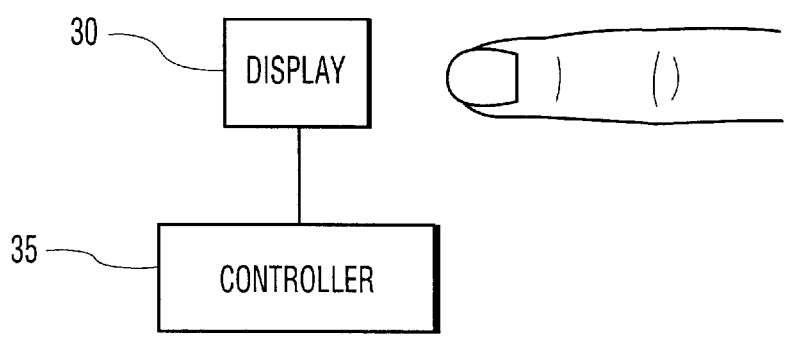
FIG. 3 shows the electronic device in accordance with the invention.

FIG. 3 shows a block diagram of the GUI touch-screen display 30 and its associated controller 35 which permits touch-screen actuation of the GUI.

It will thus be seen that the objects set forth above, among those made apparent from the preceding description, are efficiently attained and, since certain changes may be made in carrying out the above method and in the construction set forth without departing from the spirit and scope of the invention, it is intended that all matter contained in the above description and shown in the accompanying drawings shall be interpreted as illustrative and not in a limiting sense.

What is claimed is:

1. A graphical user interface touch screen, for displaying a user-controllable function of an electronic device, comprising:

means for displaying the function as an icon, the function corresponding to a plurality of figures, and displayed at a scale size in which the function is recognizable by a user but too small to easily select features of the plurality of features; and means for providing a magnified version of a subset of features of the plurality of features upon the user touching an area of the icon, thereby facilitating a selection of a select one of the subset of features.

2. The graphical user interface touch screen as claimed in claim 1, wherein the graphical user interface touch screen further comprises:

means for causing the magnified version of the subset of features to scroll across the icon such that a new subset of features of the plurality of features is magnified.

3. The graphical user interface touch screen as claimed in claim 1, wherein the graphical user interface touch screen further comprises:

means for displaying the icon at the first scale size after selection of a feature.

4. The graphical user interface touch screen as claimed in claim 1, wherein the graphical user interface touch screen further comprises:

means for indicating that the select one of the subset of features has been selected by the user.

5. The graphical user interface touch screen as claimed in claim 1, wherein the a size of icon has a size is the same as a size of the magnified version of the subset of the features.

6. The graphical user interface touch screen as claimed in claim 5, wherein the area of the icon has a corresponding location on the touch screen, and the magnified version of the subset of features is displayed at the same location on the touch screen upon the user touching the area of the icon.

7. A portable data device, comprising:

a graphical user interface touch screen that is configured to display a plurality of functions of the portable data device in the form of icons, at least one function corresponding to a plurality of features, and displayed at a scale size in which the at least one function is recognizable but too small to easily access select features of the plurality of features; and a controller that is configured to provide a magnified version of a subset of features of the plurality of features upon a user touching an area of the icon, such that the subset of features becomes large enough for the user to easily select a feature of the subset of features and thereby control the portable data device.

8. The portable data device as claimed in claim 7, wherein the at least one function is a keyboard function, and the plurality of features for the keyboard function corresponds to a plurality of selectable alphanumeric keys.

9. The portable data device as claimed in claim 7, wherein the controller includes means for, upon the user touching an edge of the magnified version of the subset of features, providing a magnified version of another subset of features of the plurality of features.

10. The remote control as claimed in claim 9, wherein the icon depicts a remote control device for a particular type of consumer electronic device, the plurality of features corresponding to individual controls of the remote control device for the particular type of consumer electronic device.

11. A remote control for controlling a consumer electronics device, comprising:

a graphical user interface touch screen which displays at least one function of the remote control in the form of an icon, the function corresponding to a plurality of features, and displayed at a scale size in which the function of an icon is recognizable but too small to easily access select a select feature of the plurality of features corresponding to the function; and a controller that is configured to provide a magnified version of a subset of features of the plurality of features upon a user touching an area of the icon, such that the magnified version of the subset of features becomes large enough for the user to easily select one of the subset of features by touching the touch screen.

12. A method of operating an electronic device, comprising the steps:

displaying, on a graphical user interface touch screen, a function of the electronic device in the form of an icon, the function corresponding to a plurality of features, and displayed at a scale size in which the function is recognizable by a user but too small to easily select a feature of the plurality of features of the function; and providing a magnified version of a subset of features of the plurality of features upon the user touching an area of the icon such that the magnified version becomes large enough for the user to easily access the subset of features by touching the touch screen.

13. The method of operating an electronic device as claimed in claim 11, wherein the method further comprises the step:

scrolling the magnified version such that new subsets of the plurality of features become magnified.

\* \* \* \* \*

UNITED STATES PATENT AND TRADEMARK OFFICE
CERTIFICATE OF CORRECTION

| | | |
|---|---|---|
| PATENT NO. | : 6,211,856 B1 | |
| APPLICATION NO. | : 09/062364 | |
| DATED | : April 3, 2001 | |
| INVENTOR(S) | : Sung M. Choi et al. | |

It is certified that error appears in the above-identified patent and that said Letters Patent is hereby corrected as shown below:

Column 3, line 50 to Column 4, line 13 should read as follows:

1. A graphical user interface touch screen, for displaying a user-controllable function of an electronic device, comprising:
    means for displaying the function as an icon, the function corresponding to a plurality of user-selectable features, the icon being displayed with the plurality of the user-selectable features, and the icon being displayed at a first scale size; and
    means for displaying a subset of the displayed features at a second scale size that is larger than the first scale size, upon a user touching an area of the icon, thereby facilitating a selection of a select one of the subset of features.

2. The graphical user interface touch screen as claimed in claim 1, wherein the graphical user interface touch screen further comprises:
    means for causing the subset of the features displayed at the second scale size to scroll across the icon such that a new subset of the features is displayed at the second scale size.

3. The graphical user interface touch screen as claimed in claim 1, wherein the graphical user interface touch screen further comprises:
    means for displaying the icon at the first scale size after selection of a feature.

4. The graphical user interface touch screen as claimed in claim 1, wherein the graphical user interface touch screen further comprises:
    means for indicating that the select one of the subset of features has been selected by the user.

5. The graphical user interface touch screen as claimed in claim 1, wherein a size of the icon is substantially the same as a further size of the subset of the features displayed at the second scale size.

Signed and Sealed this
Seventh Day of August, 2012

David J. Kappos
*Director of the United States Patent and Trademark Office*

CERTIFICATE OF CORRECTION (continued)
U.S. Pat. No. 6,211,856 B1

Column 4, line 14 to Column 4, line 47 should read as follows:

6. The graphical user interface touch screen as claimed in claim 5, wherein the area of the icon has a corresponding location on the touch screen, and the subset of the features displayed at the second scale size is displayed in substantially the same location on the touch screen upon the user touching the area of the icon.

7. A portable data device, comprising:
   a graphical user interface touch screen that is configured to display a user-controllable function as an icon, the function corresponding to a plurality of user-selectable features, the icon being displayed with the plurality of the user-selectable features, and the icon being displayed at a first scale size; and
   a controller to control displaying a subset of the displayed features at a second scale size that is larger than the first scale size, upon a user touching an area of the icon.

8. The portable data device as claimed in claim 7, wherein the function comprises a keyboard function, and the plurality of features for the keyboard function corresponds to a plurality of selectable alphanumeric keys.

9. The portable data device as claimed in claim 7, wherein the controller includes means for, upon the user touching an edge of the subset of the features displayed at the second scale size, causing another subset of the features to be displayed at the second scale size.

10. The remote control as claimed in claim 11, wherein the icon depicts a remote control device for a particular type of consumer electronic device, the plurality of features corresponding to individual controls of the remote control device for the particular type of consumer electronic device.

Column 4, line 48 to Column 6, line 5 should read as follows:

11. A remote control for controlling a consumer electronics device, comprising:
    a graphical user interface touch screen which displays a user-controllable function of the remote control as an icon, the function corresponding to a plurality of user-selectable features, the icon being displayed with the plurality of the user-selectable features, and the icon being displayed at a first scale size; and
    a controller to control displaying a subset of the features at a second scale size that is larger than the first scale size, upon a user touching an area of the icon.

12. A method of operating an electronic device, comprising the steps:
    displaying, on a graphical user interface touch screen, a function of the electronic device as an icon, the function corresponding to a plurality of user-selectable features, the icon being displayed with the plurality of the user-selectable features, and the icon being displayed at a first scale size; and
    displaying a subset of the features at a second scale size that is larger than the first scale size, upon the user touching an area of the icon.

13. The method of operating an electronic device as claimed in claim 12, wherein the method further comprises the step:
   scrolling the subset of features displayed at the second scale size such that new subsets of the plurality of features become displayed at the second scale size.